United States Patent [19]
Kranzen

[11] Patent Number: 5,969,390
[45] Date of Patent: Oct. 19, 1999

[54] LAYOUT SOLUTION FOR ELECTROMAGNETIC INTERFERENCE REDUCTION

[75] Inventor: Bruno Kranzen, San Jose, Calif.

[73] Assignee: Zilog, Inc., Campbell, Calif.

[21] Appl. No.: 09/158,713

[22] Filed: Sep. 22, 1998

Related U.S. Application Data

[63] Continuation of application No. 08/898,072, Jul. 22, 1997, abandoned.

[51] Int. Cl.$^6$ .................................................. H01L 23/62
[52] U.S. Cl. .......................... 257/363; 257/355; 257/207
[58] Field of Search ................... 257/363, 360, 257/355, 358, 206, 203, 207

[56] References Cited

U.S. PATENT DOCUMENTS

| | | |
|---|---|---|
| 4,527,213 | 7/1985 | Ariizumi ................................ 257/363 |
| 4,893,168 | 1/1990 | Takahashi et al. . |
| 5,019,883 | 5/1991 | Mori et al. . |
| 5,218,222 | 6/1993 | Roberts ................................. 257/363 |
| 5,430,595 | 7/1995 | Wagner et al. . |
| 5,473,169 | 12/1995 | Ker et al. ............................. 257/362 |
| 5,811,856 | 9/1998 | Lee ...................................... 257/355 |

*Primary Examiner*—David B. Hardy
*Attorney, Agent, or Firm*—Majestic, Parsons, Siebert & Hsue

[57] ABSTRACT

A polysilicon resistor is added between a source (ground or power) of an EMI core circuitry and a source of the EMI peripheral circuitry. In this way, the electromagnetic interference of an integrated circuit is reduced. The added polysilicon resistor reduces the di/dt of the current passing between the power and the ground of the EMI core circuitry so that the EMI is reduced.

19 Claims, 3 Drawing Sheets

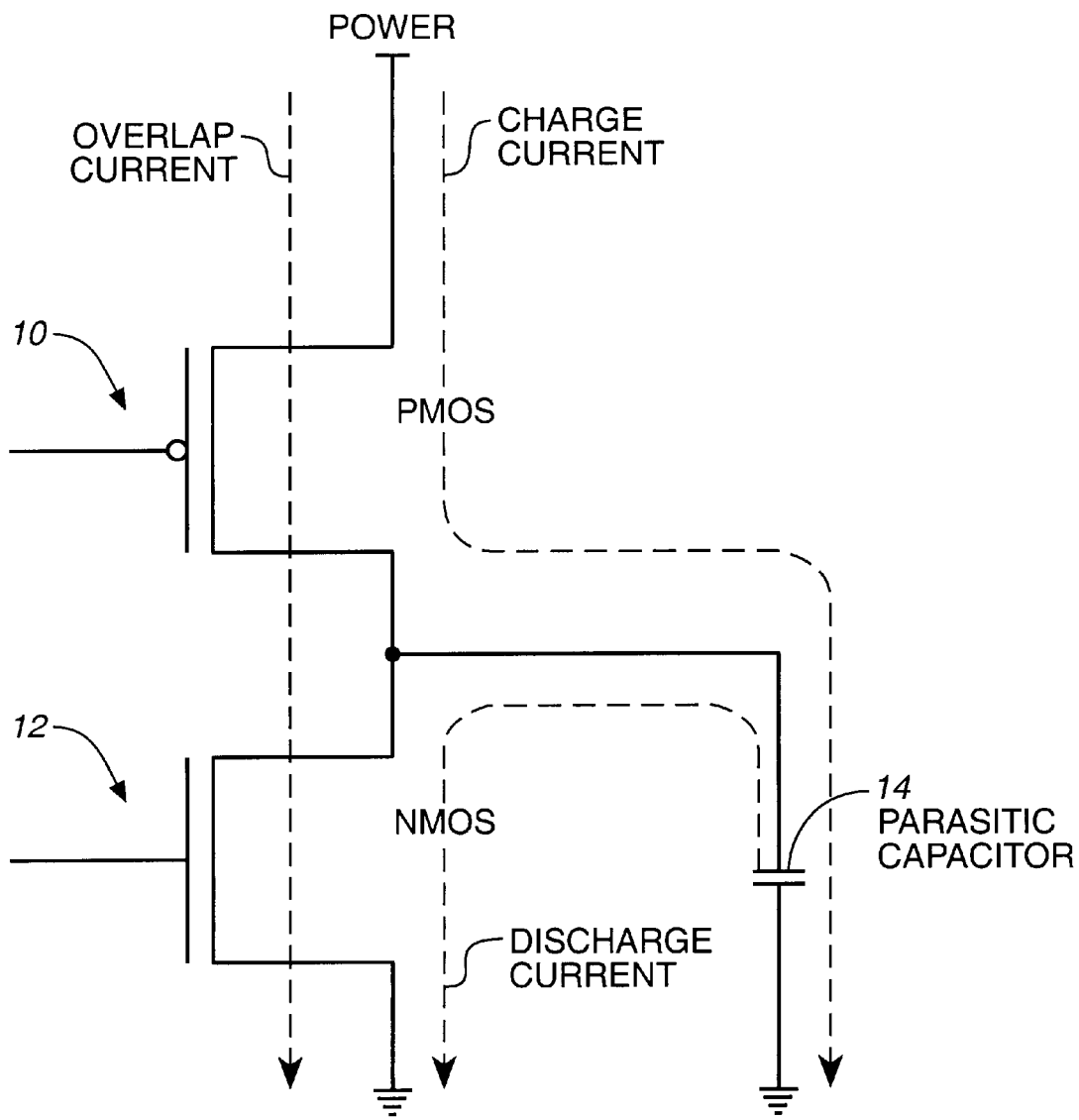
FIG._1
*(PRIOR ART)*

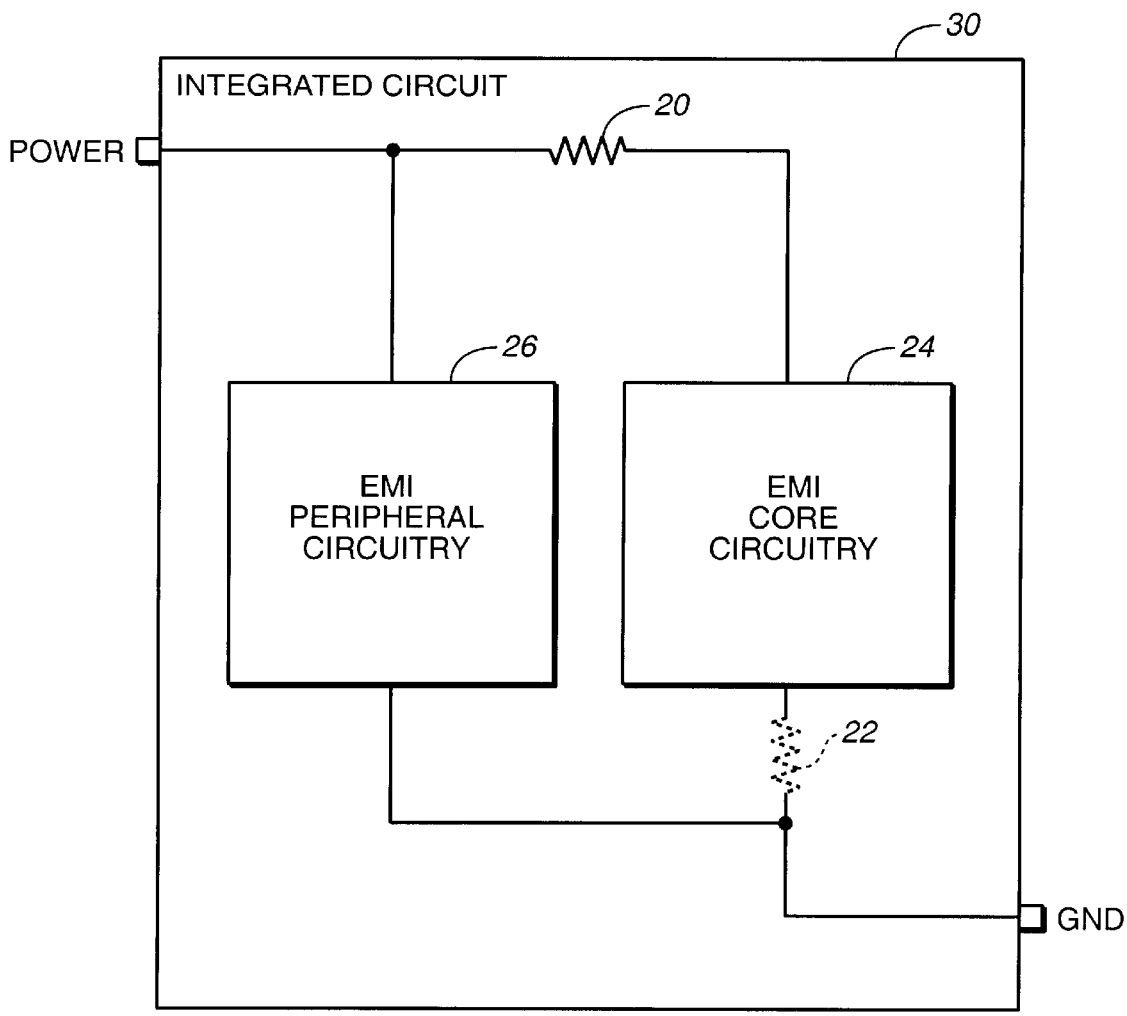
FIG._2
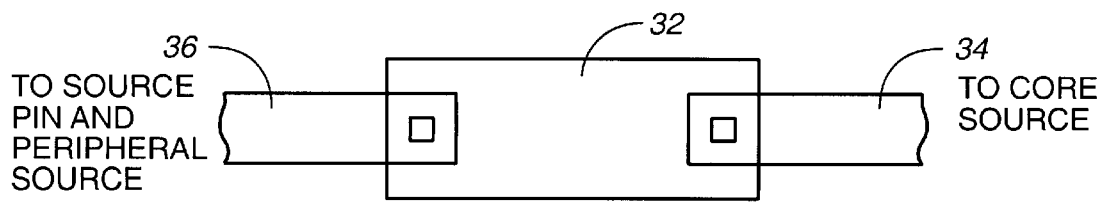
FIG._3

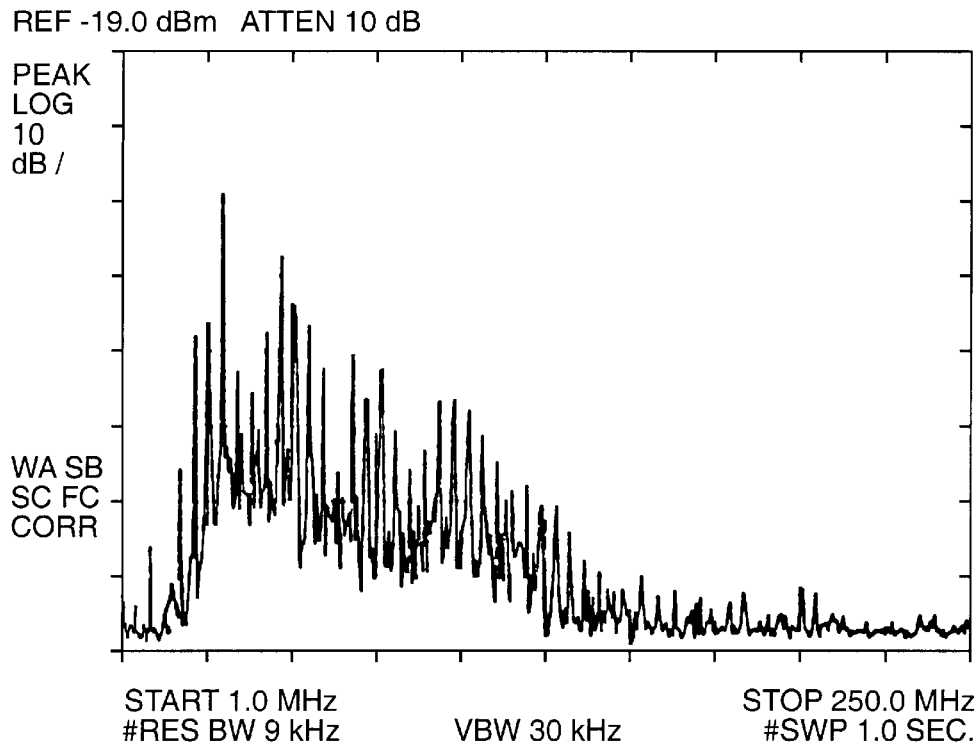
FIG._4
*(PRIOR ART)*
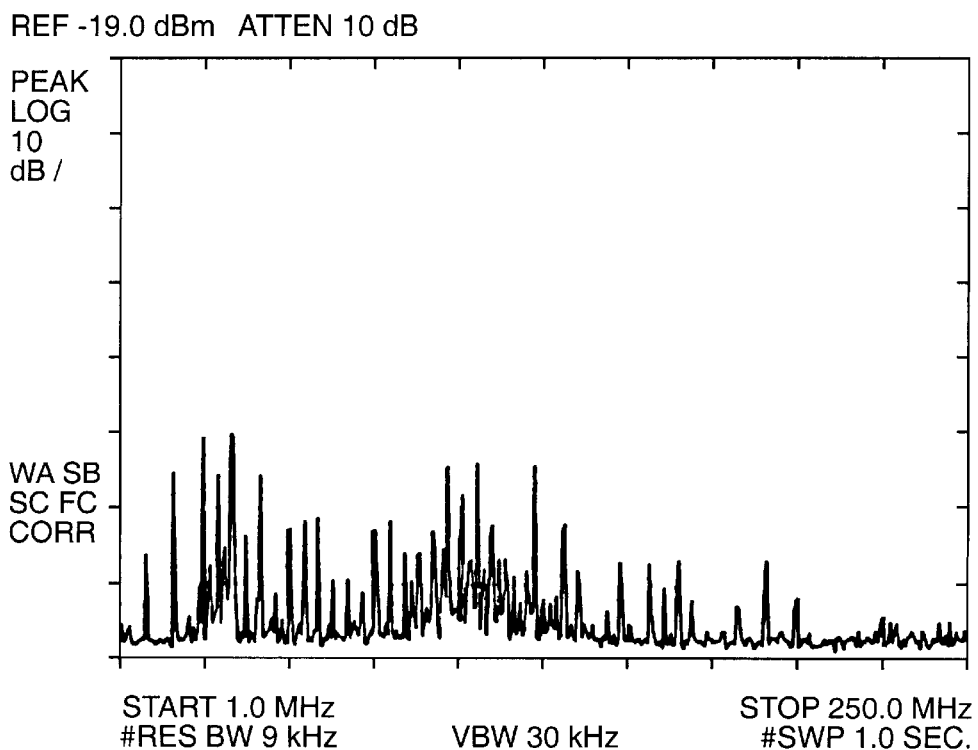
FIG._5

LAYOUT SOLUTION FOR ELECTROMAGNETIC INTERFERENCE REDUCTION

CROSS-REFERENCE TO RELATED APPLICATION

This is a continuation of application Ser. No. 08/898,072, filed Jul. 22, 1997 now abandoned.

BACKGROUND OF THE INVENTION

The present invention relates to methods and structures for reducing electromagnetic interference (EMI) on integrated circuits. Some integrated circuits inadvertently transmit electromagnetic energy that can interfere with electronic devices. For this reason, the Federal Communications Commission (FCC) has regulations concerning the acceptable levels of transmitted energy for electronic devices.

Electromagnetic interference is especially a problem for small-channel size integrated circuits. By reducing the channel size, the total size and thus the cost of the integrated circuit is reduced. However, small-channel integrated circuits operate faster.

It is desired to reduce electromagnetic interference in order to meet the FCC requirements and device specifications. One way to reduce electromagnetic interference is to use metal shielding about the integrated circuit. Metal shielding prevents electromagnetic energy from radiating away. Unfortunately, metal shielding is prohibitively expensive for some applications.

It is desired to have an improved and more economical method of reducing the electromagnetic interference caused by an integrated circuit.

SUMMARY OF THE PRESENT INVENTION

In the present method and apparatus, a resistor is used between a source of a core area of the integrated circuit and a source of a peripheral area of the integrated circuit. The resistor is preferably a polysilicon resistor, but can also be a diffusion or well-resistor. The resistor inhibits quick changes in the current drawn by the wore area of the integrated circuit. The current drawn by the transistors of the core area passes through the resistor. This reduces the instantaneous change in current over the instantaneous change in time (di/dt) and thus reduces some of the high frequency components of the signal.

The polysilicon resistor can be placed in series with a power or ground of the core area. The resistance value of the resistor is chosen so as to reduce the EMI but not slow the circuit too much. In a preferred embodiment, the polysilicon resistor has a resistance of at least 50 ohms. More preferably, the polysilicon resistor has a resistance of about 90 ohms.

The EMI peripheral areas of the IC are areas for which it is desired to directly connect the circuitry to the power and ground pins of the chip. The peripheral area can include the oscillator, pad ring and, optionally, random access memory (RAM). The oscillator controls the clock. Directly connecting the oscillator to the power and ground will ensure that the clock operates properly. Because the pad ring controls input/output and interacts with outside circuits, it is not desired to connect this section to power or ground through a resistor. In a preferred embodiment, there are more transistors in the EMI core area than in the EMI peripheral area.

The present invention also includes a method of modifying a layout of an integrated circuit design in order to reduce electromagnetic interference. A polysilicon resistor can be easily added to the existing integrated circuit design. The polysilicon resistor is positioned between a source of the EMI peripheral and the EMI core area so that the power for the EMI core is connected in series through the resistor. In the preferred embodiment, the layout is changed by modifying a polysilicon deposition layout to add a polysilicon resistor and modifying the metallization layout in order to connect to the polysilicon resistor.

The polysilicon resistor used with a preferred embodiment of the present invention fits within a small area so the integrated circuit layout need not be radically modified. In a preferred embodiment, the polysilicon resistor fits in an area a thousand microns by a thousand microns. In one embodiment, the polysilicon resistor is a rectangle 200 microns by 600 microns.

BRIEF DESCRIPTION OF THE DRAWINGS

The above and other features and aspects of the present invention will become more apparent upon the reading of the following detailed description in conjunction with the accompanying drawings, in which:

FIG. 1 is a diagram of a prior art pair of Complementary Metal-Oxide-Silicon (CMOS) transistors;

FIG. 2 is a diagram of an apparatus of the present invention showing a polysilicon resistor positioned between a source of the EMI core circuitry and a source of the EMI peripheral circuitry;

FIG. 3 is a diagram of a polysilicon resistor used with the present invention;

FIG. 4 is a graph of EMI intensity versus wavelength for an integrated circuit without the polysilicon resistor EMI fix of the present invention; and FIG. 5 is a graph of EMI intensity versus wavelength for a modified layout design of the integrated circuit including the polysilicon resistor EMI fix of the present invention.

DETAILED DESCRIPTION OF THE PREFERRED EMBODIMENTS

FIG. 1 is a diagram of a prior art pair of complementary metal-oxide-silicon (CMOS) transistors 10 and 12. The complementary metal-oxide-silicon (CMOS) transistors include a PMOS transistor 10 and an NMOS transistor 12. Capacitor 14 is an inherent parasitic capacitor formed between the two CMOS transistors 10 and 12.

When the PMOS transistor 10 is on and NMOS transistor 12 is off, a charge current flows through CMOS transistor 10 to the parasitic capacitor 14. When the NMOS transistor 12 is on and the PMOS transistor 10 is off, a discharge current flows from the parasitic capacitor 14 through the NMOS transistor 12 to the ground. In switching between these two states, there is a transitional period when both the PMOS and NMOS transistors are on. In this transitional stage, an overlap current flows through both transistors from the power to the ground. The overlap current tends to be a sharp step function. As seen in the frequency domain, step functions include a wide spectrum of frequencies including many frequencies that radiate from the IC. The many CMOS transistor pairs-in an integrated circuit produce a relatively large combined overlap current.

FIG. 2 is a diagram showing the apparatus of the present invention. A resistor 20 or 22 is positioned between the source of the core circuitry 24 and the source of the peripheral circuitry 26 on the integrated circuit. The resistor 20 or 22 is positioned in series between a source of the chip and the EMI core circuitry, the power for the transistors of the EMI core circuitry 24 must pass through the resistor and thus slows down the switching of the transistors. Slowing down the switching reduces the di/dt between the chip power and ground and thus reduces the electromagnetic interference caused by the chip.

In the present invention, specific areas are designated as being part of the EMI peripheral circuitry and are connected directly to the power and ground of the chip rather than through a resistor. The peripheral circuitry 26 can include the oscillator, pad ring and random access memory for the chip. Typically, each functional area on the integrated circuit has its own power and ground lines connecting to the power and ground of the chip, so that it is relatively easy to allocate a given functional area as part of the EMI core circuitry or EMI peripheral circuitry.

In a preferred embodiment, at least fifty percent of the transistors in the integrated circuit 30 are included in the EMI core circuitry 24. The more transistors included in the EMI core circuitry, the greater the possible EMI reduction for the IC.

FIG. 3 is a diagram of a polysilicon resistor 32 used with the present invention. One side of the polysilicon resistor is connected by a metal wire 34 to the source of the EMI core circuitry and the other side of the polysilicon resistor is connected on the other side by metal wire 36 to the source pin of the chip and a source of the EMI peripheral circuitry. Alternately, another type of resistor such as a diffusion or well resistor can be used.

In a preferred embodiment, the polysilicon resistor 32 has a resistance of at least 50 ohms. In a more preferred embodiment, the polysilicon resistor 32 has a resistance of about 90 ohms. Assuming that a "square" of polysilicon on the IC has a resistance of about 30 ohms, the 90-ohm resistor can be a strip three "squares" long on the integrated circuit. In a preferred embodiment, the polysilicon resistor is positioned on an area 200 microns by 600 microns.

The present invention also comprises a method of modifying an integrated circuit design to reduce the electromagnetic interference. In the fix, the polysilicon deposition layout is changed to add the polysilicon resistor 32 and the metallization layout is modified to form the proper connection to the polysilicon resistor.

FIG. 4 illustrates a graph of EMI intensity versus wavelength for an integrated circuit using the polysilicon resistor fix. The original layout design is for a mouse controller chip. When the size of the IC was reduced, the EMI produced by the circuit increased to unacceptable levels.

FIG. 5 is a graph of the EMI intensity versus wavelength for a modified layout design including the 90-ohm polysilicon EMI fix. Note that the electromagnetic interference is reduced drastically using the fix. The polysilicon resistor fix allows the Integrated Circuit to remain cost-effectively small while reducing the EMI.

The polysilicon resistor also slows the switching of the transistors. The Integrated Circuit illustrated in FIG. 4 has a device speed of 25 MHz. By adding the polysilicon resistor fix, the speed of the transistors in the core area is reduced to about 10 MHz. The mouse controller chip, however, only requires transistor switching at 4 MHz.

One less preferable way to reduce the EMI is to make the transistors of the core area weaker by making them longer and/or narrower. This is a less advantageous solution because it requires a complete re-layout of the integrated circuit design.

Various details of the implementation and method are merely illustrative of an invention. It will be understood that changes in such details are within the scope of the invention, which is to be limited only by the appended claims.

What is claimed is:

1. A method of reducing the electromagnetic interference ("EMI") of an integrated circuit, the method comprising:

laying out a chip design for an integrated circuit having, EMI core comprising a core supply and EMI peripheral circuitry comprising a peripheral supply such that an EMI reduction resistor is positioned between said core supply and said peripheral supply of the integrated circuit design, wherein the EMI of the integrated circuit is reduced.

2. The method of claim 1, wherein the EMI reduction resistor is positioned between a core power of the core supply and a peripheral power of the peripheral supply.

3. The method of claim 1, wherein the EMI reduction resistor is positioned between a core ground of the core supply and a peripheral ground of the peripheral supply.

4. The method of claim 1, wherein the EMI reduction resistor is a polysilicon resistor.

5. The method of claim 1, wherein the EMI reduction resistor has at least 50 ohms resistance.

6. The method of claim 1, wherein the EMI core circuitry contains more transistors than the EMI peripheral circuitry.

7. A method of reducing the electromagnetic interference ("EMI") of an integrated circuit, the method comprising:

providing an integrated circuit design layout for a chip having EMI core comprising a core supply and EMI peripheral circuitry comprising a peripheral supply; and modifying the circuit design layout such that an EMI reduction resistor is positioned between the core supply and the peripheral supply so as to reduce the electromagnetic interference of the chip formed using the modified circuit design layout, wherein the EMI of the integrated circuit is reduced.

8. The method of claim 7, wherein the EMI reduction resistor is a polysilicon resistor.

9. The method of claim 8, wherein the modifying step includes modifying a layout for a polysilicon deposition and a layout for a metallization layer.

10. The method of claim 7, wherein the EMI reduction resistor is positioned between a core power of the core supply and a peripheral power of the peripheral supply.

11. The method of claim 7, wherein the EMI reduction resistor is positioned between a core ground of the core supply and a peripheral ground of the peripheral ground.

12. The method of claim 7, wherein the EMI reduction resistor has at least 50 ohms resistance.

13. The method of claim 7, wherein the EMI core circuitry contains more transistors than the EMI peripheral circuitry.

14. An integrated circuit comprising:

an electromagnetic interference core circuitry, an electromagnetic interference peripheral circuitry; and an electromagnetic interference reduction resistor positioned between a core supply of the electromagnetic interference core circuitry and a peripheral supply of the electromagnetic interference peripheral circuitry, wherein the electromagnetic interface of the integrated circuit is reduced.

15. The integrated circuit of claim 14, wherein the electromagnetic interference reduction resistor is positioned between a core power of the core supply and a peripheral power of the peripheral supply.

16. The integrated circuit of claim 14, wherein the electromagnetic interference reduction resistor is positioned between a core ground of the core supply and a peripheral ground of the peripheral supply.

17. The integrated circuit of claim 14, wherein the electromagnetic interference reduction resistor is a polysilicon resistor.

18. The integrated circuit of claim 14, wherein the electromagnetic interference reduction resistor has at least 50 ohms resistance.

19. The integrated circuit of claim 14, wherein the electromagnetic interference core circuitry contains more transistors than the electromagnetic interference peripheral circuitry.

* * * * *